United States Patent
Dent et al.

(10) Patent No.: US 7,538,704 B2
(45) Date of Patent: May 26, 2009

(54) DIRECT RF D-TO-A CONVERSION

(75) Inventors: Paul Wilkinson Dent, Pittsboro, NC (US); Nikolaus Klemmer, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/764,956

(22) Filed: Jun. 19, 2007

(65) Prior Publication Data

US 2008/0316076 A1 Dec. 25, 2008

(51) Int. Cl.
*H03M 3/00* (2006.01)
(52) U.S. Cl. .................. 341/143; 341/144; 341/141
(58) Field of Classification Search ............. 341/141, 341/143, 144
See application file for complete search history.

(56) References Cited

U.S. PATENT DOCUMENTS

| | | | |
|---|---|---|---|
| 5,210,450 A | 5/1993 | Parkinson | |
| 5,376,829 A | 12/1994 | Rogers et al. | |
| 5,444,864 A * | 8/1995 | Smith | 455/84 |
| 5,521,946 A | 5/1996 | Main | |
| 5,703,587 A | 12/1997 | Clark et al. | |
| 5,760,726 A | 6/1998 | Koifman et al. | |
| 5,848,060 A * | 12/1998 | Dent | 370/281 |
| 5,886,752 A | 3/1999 | Cross | |
| 6,177,893 B1 | 1/2001 | Velazquez et al. | |
| 6,184,808 B1 | 2/2001 | Nakamura | |
| 6,211,722 B1 | 4/2001 | Mattia et al. | |
| 6,526,264 B2 * | 2/2003 | Sugar et al. | 455/84 |
| 6,815,984 B1 | 11/2004 | Bowers et al. | |
| 6,937,178 B1 | 8/2005 | Rempfer et al. | |
| 6,963,297 B2 * | 11/2005 | Robinson et al. | 341/143 |
| 7,098,831 B2 | 8/2006 | Confalonieri et al. | |
| 7,176,820 B1 | 2/2007 | Fuller et al. | |
| 2001/0035994 A1 * | 11/2001 | Agazzi et al. | 359/152 |
| 2003/0020644 A1 | 1/2003 | Yeap et al. | |
| 2005/0258992 A1 | 11/2005 | Fontaine | |
| 2006/0164275 A1 | 7/2006 | Fuchs et al. | |

FOREIGN PATENT DOCUMENTS

DE 4304262 10/1993

(Continued)

OTHER PUBLICATIONS

Barkin, D. B. et al. "A CMOS Oversampling Bandpass Cascaded D/A Converter with Digital FIR and Current-Mode Semi-Digital Filtering." IEEE Journal of Solid-State Circuits, vol. 39, No. 4, Apr. 2004, pp. 585-594.

(Continued)

*Primary Examiner*—Howard Williams
(74) *Attorney, Agent, or Firm*—Coats & Bennett, P.L.L.C.

(57) ABSTRACT

A modulator described herein provides digital modulation and direct digital-to-analog conversion capable of achieving 12-bit resolution or higher for high frequency signals. The modulator comprises a digital modulator, conversion circuit, and multiplexer. The digital modulator generates a plurality of sample streams at a plurality of different sample phases that collectively represent a desired modulated digital carrier waveform modulated by a digital input signal. The conversion circuit converts the sample streams into a plurality of continuous analog signals. The multiplexer multiplexes the analog signals together to generate a modulated analog carrier signal representative of the desired modulated digital carrier waveform.

42 Claims, 10 Drawing Sheets

FOREIGN PATENT DOCUMENTS

| | | |
|---|---|---|
| DE | 196 00 884 | 7/1997 |
| EP | 1 160 986 | 5/2001 |
| EP | 1 659 720 | 5/2006 |
| JP | 6077792 | 3/1994 |
| WO | WO 2006/103585 | 10/2006 |

OTHER PUBLICATIONS

Harris, F. et al. "On Synthesizing High Speed Sigma-Delta DACs by Combining the Outputs of Multiple Low Speed Sigma-Delta DACs." Conference Record of the 36th Conference on Signals, Systems and Computers, Pacific Groove, CA, Nov. 3-6, 2002, vol. 2, pp. 1050-1054.

Jerng, A. et al. "A Wideband ΔΣ Digital-RF Modulator with Self-Tuned RF Bandpass Reconstruction Filter." IEEE 2006 Custom Integrated Circuits Conference (CICC), Sep. 1, 2006, pp. 125-128.

Neitola, M. et al. "Design of a Wideband Transmit Delta-Sigma DAC." The 8th IEEE International Conference on Electronics, Circuits, and Systems, Piscataway, NJ, Sep. 2, 2001, vol. 2, pp. 1053-1056.

* cited by examiner

DIRECT RF D-TO-A CONVERSION

BACKGROUND

The present invention generally relates to wireless communication devices, and particularly to the generation of analog carrier waveforms for transmission from a wireless communication device.

Depending on the governing communication standard, wireless communication signals are transmitted and received in one or more frequency bands, such as the 850 MHz and 1900 MHz frequency bands used in the United States and the 900 MHz and 1800 MHz frequency bands used in Europe. To enable one wireless communication device to operate in different countries and in multiple frequency bands according to one or more communication standards, wireless communication devices often use analog frequency synthesizers and modulation circuits specific to each desired frequency band.

Conventional wireless communication devices integrate such analog circuits with digital processing circuits. As technology and manufacturing techniques improve, the geometry of the silicon chips used to manufacture the digital circuits decreases. This advantageously reduces the overall size and cost of the device and increases the processing speed of the device. However, the shrinking size of digital circuits complicates the integration of digital and analog circuits.

SUMMARY

The present invention provides a method of digital modulation and direct digital-to-analog conversion capable of achieving 12-bit resolution or higher. The present invention generates a plurality of sample streams at a plurality of different sample phases that collectively represent a desired digital carrier waveform modulated by a digital input signal. A plurality of digital-to-analog converters converts the sample streams into a plurality of continuous analog signals. A multiplexer multiplexes the analog signals together to generate a modulated analog carrier signal representative of the desired modulated digital carrier waveform.

DETAILED DESCRIPTION

Figure 1:
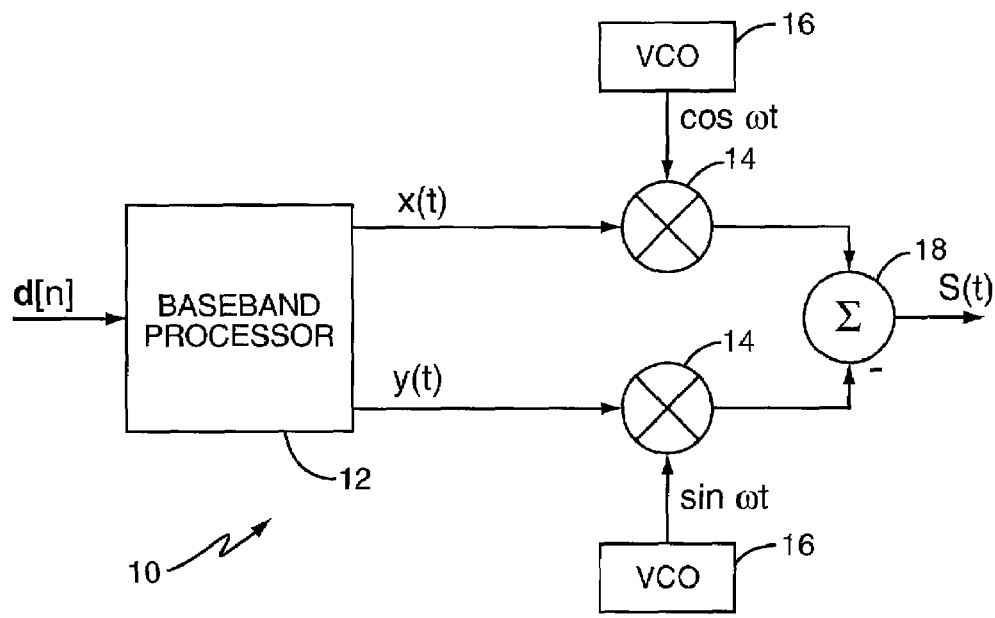
FIG. 1 shows a conventional modulator.

FIG. 1 shows a quadrature modulator 10 that outputs a modulated analog carrier waveform S(t) responsive to a digital input signal d[n]. Baseband processor 12 converts the digital input signal d[n] into two Cartesian analog signals, x(t) and y(t). Multipliers 14 use modulation signals output by oscillators 16 at a desired carrier frequency ω to modulate the input analog signals, and combiner 18 combines the modulated analog signals to generate the modulated analog carrier waveform S(t), which may be represented by:

$$S(t)=x(t)\cos(\omega t)-y(t)\sin(\omega t). \quad (1)$$

An equivalent representation for S(t) is given by:

$$S(t)=A(t)\cos(\omega t+P(t))=\text{Real}\{A(t)e^{jP(t)}e^{j\omega t}\}, \quad (2)$$

where $A(t)=\sqrt{x^2(t)+y^2(t)}$ and describes the amplitude variation with time, and $P(t)=\arctan(y(t)/x(t))$ and describes the phase variation with time. Equation (2) may be rewritten as:

$$S(t)=\text{Real}\{A(t)e^{jP'(t)}e^{j\omega_o t}\}, \quad (3)$$

where $P'(t)=P(t)+(\omega-\omega_o)t$ and $\omega-\omega_o$ represents the difference between the signal frequency $\omega_o$ relative to a baseline frequency ω. This representation makes it possible to describe a combined amplitude and phase modulation {A(t),P(t)} of a baseline frequency ω in terms of amplitude and phase modulation of any nearby signal frequency $\omega_o$ with a modified phase modulation P'(t). The term $e^{jP(t)}$ (or $e^{jP'(t)}$) is generally split into corresponding real and imaginary components, cos (P(t)) and sin(P(t)) respectively, to obtain the quadrature modulation components expressed in Equation (4).

$$I(t)=A(t)\cos(P(t))$$
$$Q(t)=A(t)\sin(P(t)) \quad (4)$$

When S(t) is calculated using P'(t), these quadrature modulation components are required to modulate the cosine and sine signals at $\omega_o$ to produce the desired carrier signal at ω.

The sample rate required to represent I(t) and Q(t) is at least twice the highest frequency component contained therein. For a band of frequencies, the highest frequency component will be increased by the bandwidth, e.g., $\omega-\omega_o$. For example, the widest bandwidth cellular modulation waveform currently in widespread use is known variously as 3G, WCDMA or UMTS, and has I, Q components approximately up to 2 MHz. Adequately representing these signals requires sample rates greater than 4 MHz. Using the bare minimum sample rate has the disadvantage that a sharp cut-off filter is required to remove the sample clock and aliasing while leaving the wanted components intact. The difficulty of this anti-aliasing filter may be substantially reduced by calculating the components at a higher than minimum sample rate, e.g., using oversampling.

The widest cellular band in common use is approximately 90 MHz wide. If $\omega_o$ was somewhere near the center of such a band, then $\omega-\omega_o$ would be less than 100 MHz. When $\omega-\omega_o$=80 MHz, for example, the highest frequency component in the I and Q waveforms computed using P'(t) would be just over 80 MHz. Adequately representing these waveforms requires a minimum sample rate of 160 MHz. Samples computed at this sample rate are denoted by I[i] and Q[i], where i is a successively increasing index. In this notation, the successive increment applied to i may be greater than 1. For example, when the successive increment is 16 the samples in the sequence would comprise for example {I[1],I[17], I[33], ... }.

Now consider the sample rate necessary to represent the entire modulated radio signal at a center frequency in the 900 MHz band, for example. Per Nyquist, the sample rate should provide at least 2 samples per cycle. Thus, the sample rate should be ≧1800 MHz. Currently, conventional systems require integrated analog and digital components for sample rates this high. As discussed above, however, integrating the analog modulation components of FIG. 1, such as multiplier 14, VCO 16, and any filters (not shown), with the digital processing components is becoming increasingly difficult.

Figure 2:
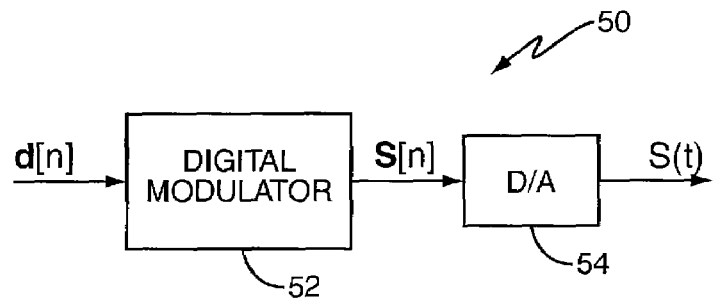
FIG. 2 shows an exemplary digital modulator.

FIG. 2 shows one alternative modulator 50 that moves the analog modulation to the digital domain. Modulator 50 generates a digital carrier waveform S[n] modulated responsive to the digital input signal d[n]. The modulated digital carrier waveform S[n] comprises a sequence of sample values that represent a desired version of S(t). According to Nyquist's theory, the sample rate of the modulated digital carrier waveform S[n] is at least twice the highest frequency component of the modulated analog carrier waveform S(t). A high speed digital-to-analog converter 54 converts the modulated digital carrier waveform S[n] into the modulated analog carrier waveform S(t), where the integer n represents a successively increasing index for the sample values in S[n].

For many applications, the high speed digital-to-analog converter 54 may have insufficient resolution. For example, many wireless communication systems require digital-to-analog converter 54 to have at least 12-bit resolution. The sample rate required for an 1800 MHz signal, for example, must be at least 3600 MHz. Digital-to-analog converters 54 capable of operating at this speed are typically limited to less than 8-bit resolution.

Figure 3:
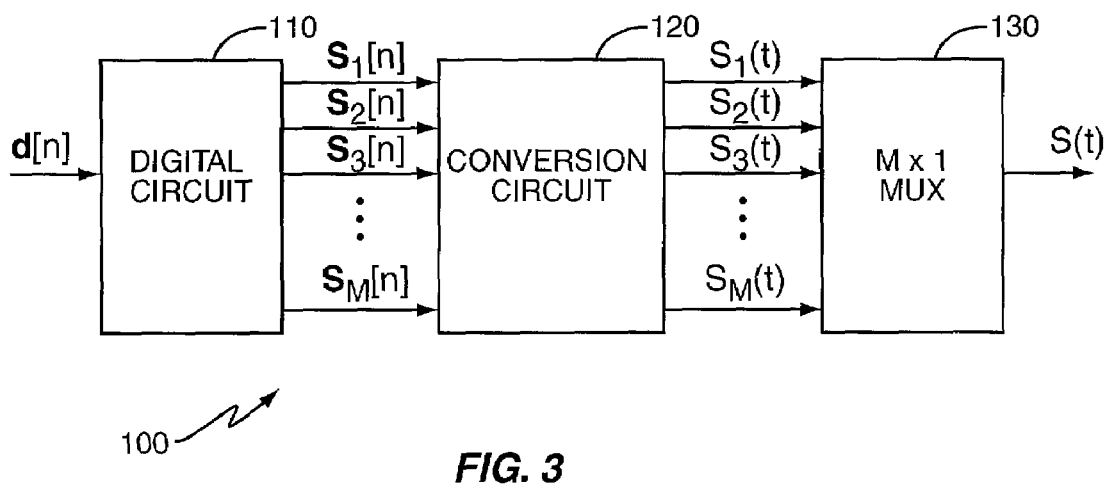
FIG. 3 shows one modulator according to one exemplary embodiment.

FIG. 3 illustrates an exemplary modulator 100 for generating an analog carrier waveform S(t) modulated responsive to a digital input signal d[n]. The modulator 100 computes sample values for the corresponding modulated digital carrier waveform S[n] responsive to the digital input signal d[n], and converts the sample values to a modulated analog carrier waveform S(t). The problem of converting high-rate waveform S[n] to analog form with a desired resolution is solved by dividing the modulated digital carrier waveform S[n] into M lower rate sub-streams $\{S_1[n], \ldots, S_m[n]\}$, individually converting each of the M lower rate sub-streams $\{S_1[n], \ldots, S_m[n]\}$ to analog form to create M analog signals $\{S_1(t), \ldots, S_m(t)\}$, and combining the individual analog signals to create a composite modulated analog carrier waveform S(t).

Figure 4:
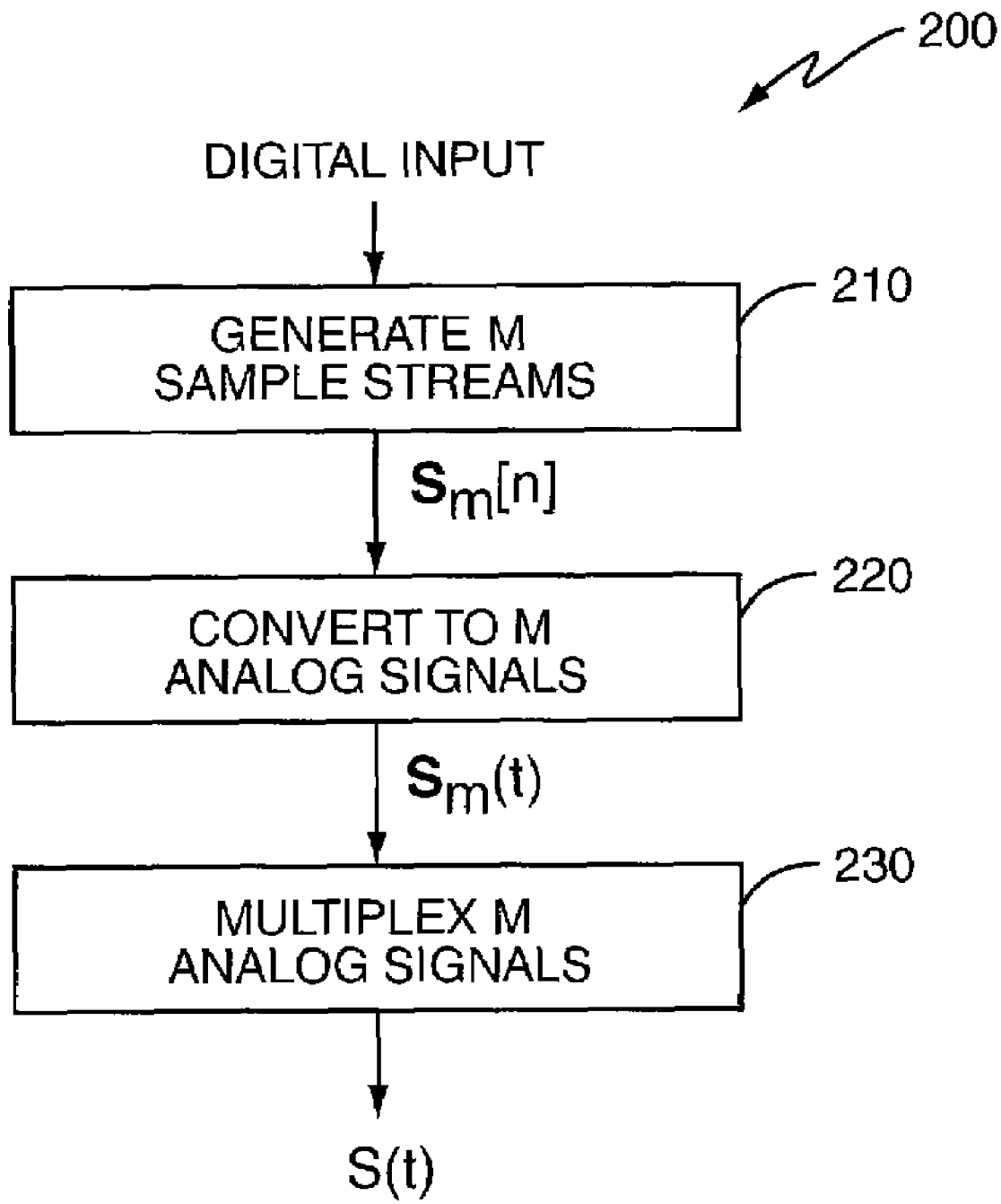
FIG. 4 shows a modulation process according to one exemplary embodiment.

Modulator 100 comprises a digital circuit 110, conversion circuit 120, and multiplexer 130, and implements the process shown in FIG. 4. Digital modulator 110 computes the sample values for each of the M sample streams $S_m[n]$ responsive to the digital input signal d[n] (block 210). Each sample stream $S_m[n]$ is input to conversion circuit 120 to create M analog signals $S_m(t)$ (block 220). An M×1 multiplexer 130 multiplexes the individual analog signals $S_m(t)$ together to create the desired modulated analog carrier waveform S(t) (block 230). When conversion circuit 120 has sufficient resolution and when there are a sufficient number of sample streams $S_m[n]$ having a sufficient sample rate, the composite modulated analog carrier waveform S(t) accurately represents the desired modulated digital carrier waveform S[n].

Each sample stream $S_m[n]$ comprises a series of sample values computed at the sampling interval, but shifted in time relative to one another, e.g., at different sample phases. More particularly, the sample values in each sample stream $S_m[n]$ are spaced by M sample periods. Thus, each sample stream has a sample rate that is 1/M times the sample rate of the desired modulated digital carrier waveform S[n], which is generally greater than or equal to the Nyquist sample rate of the modulated analog carrier waveform S(t). For example, $S_m[n]=\{S[m], S[m+M], \ldots\}$. When M=16, digital modulator 110 generates 16 sample streams, where $S_1[n]=\{S[1], S[17], \ldots\}$, $S_2[n]=\{S[2],S[18], \ldots\}$, ..., $S_{16}[n]=\{S[16], S[32], \ldots\}$. Each sample stream $S_m[n]$ has a sample rate that is 1/16 the sample rate of the desired modulated digital carrier waveform S[n]. The aggregate sample rate of the sample streams equals the sample rate of the desired modulated digital carrier waveform S[n]. While the following often uses M=16 to describe the present invention, it will be appreciated that the number of parallel sample streams $S_m[n]$ and the corresponding sampling interval may vary to meet any required sample rate.

The sample streams comprised of every $M^{th}$ sample value of the modulated digital carrier waveform S[n] represent a sample stream $S_m[n]$ having a sample rate $f_s$ that equals $(1/M) \cdot F_s$ where $F_s$, represents the sample rate of the modulated digital carrier waveform S[n]. To state Nyquist's theorem in reverse, any set of sample values may be represented as equi-spaced points on a continuous analog waveform having a bandwidth less than or equal to half the sample rate. For example, generating a sample stream having a 160 MHz sample rate is equivalent to multiplying a carrier waveform, such as a 925 MHz carrier waveform, with an impulse waveform having a 160 MHz repetition rate. The resulting spectrum comprises all equal amplitude harmonics of 160 MHz. The nearest harmonic to 925 MHz is 6×160 MHz=960 MHz, which produces a beat frequency of 35 MHz. The second nearest harmonic is 5×160 MHz=800 MHz, which produces a beat frequency of 125 MHz, which is greater than half the sample rate. Because of the reverse-Nyquist theorem, components greater than half the sample rate are not relevant. Thus, for this example a 35 MHz bandwidth waveform is sufficient to generate the sample streams.

Further, the bandwidth of each sample stream may be approximately the frequency difference between the carrier frequency of the desired carrier waveform and the nearest harmonic of the sample rate for the sample streams. The bandwidth for the sample streams may be minimized by selecting the integer value of p that satisfies:

$$pF_s = MF_o, \quad (5)$$

where $F_s$ represents the sample rate of the desired carrier waveform, $F_o$ represents the sample rate of the sample stream, and M represents the number of sample streams and the incremental spacing between sample values in each sample stream. If $F_s$ is chosen to satisfy Equation (5) for a value of $F_o$ corresponding to the center of the desired output frequency band, then the bandwidth of the sample stream will be a maximum of half the frequency band (plus any modulation bandwidth) when the operating frequency is at an extreme of the frequency band. Thus, $F_s$ may in principle be fixed, and the desired output center frequency and modulation may be determined entirely by the sample stream. When $F_o=160$ MHz, the output frequency may be chosen to be within any 160 MHz region of the frequency spectrum, since p is arbitrary and actually represents the number of whole cycles of $F_o$ that are encompassed by one complete cycle of the carrier waveform. In order to generate output signals up to the highest frequency in near-term use by cellular phone and mobile satellite communications systems, that is about 2.5 GHz, $F_s$ needs to be of the order of 5 GHz.

Based on the above, as long as the aggregate sample rate of the sample streams $S_m[n]$ meets or exceeds the minimum sample rate (e.g., the Nyquist sample rate) associated with the modulated analog carrier waveform S(t), the sample streams $S_m[n]$ will be sufficient to produce the desired modulated digital carrier waveform S[n]. For example, if each of the 16 sample streams has a sample rate of 160 MHz and a bandwidth of 35 MHz, then the aggregate sample rate (16×160 MHz=2.56 GHz) will be more than sufficient for many carrier waveforms, such as waveforms in the 900 MHz band requiring a minimum sample rate of 1.8 GHz. The digital modulator 110 may vary the number of sample streams and/or the sample rate of the sample streams to address different modulated analog carrier waveforms.

Figure 5A:
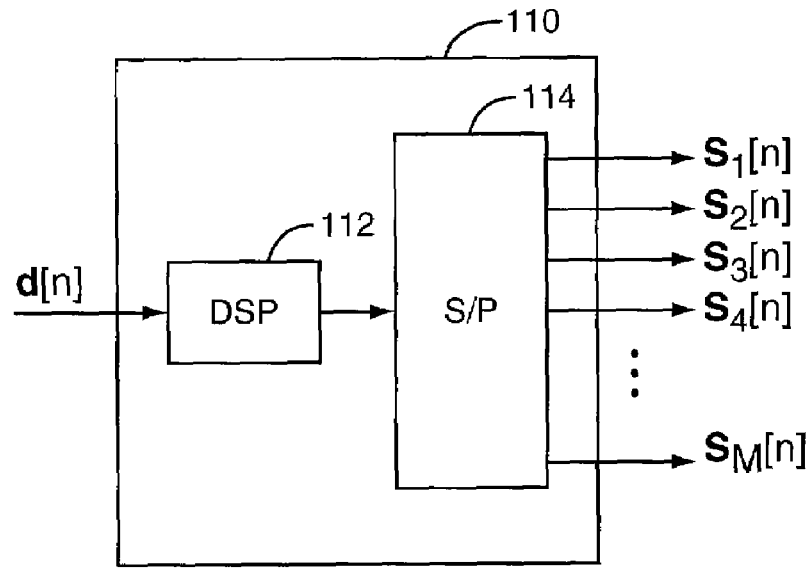
FIG. 5A shows one exemplary digital circuit for the modulator of FIG. 3.

FIG. 5A shows an exemplary digital modulator 110 comprising one digital signal processor 112 and a serial-to-parallel converter 114. Processor 112 computes the sample values for the modulated digital carrier waveform S[n] as modulated by the digital input signal d[n]. Serial-to-parallel converter 114 divides the modulated digital carrier waveform S[n] into the M lower rate sample streams $S_m[n]$ output by the digital modulator 110.

Figure 5B:
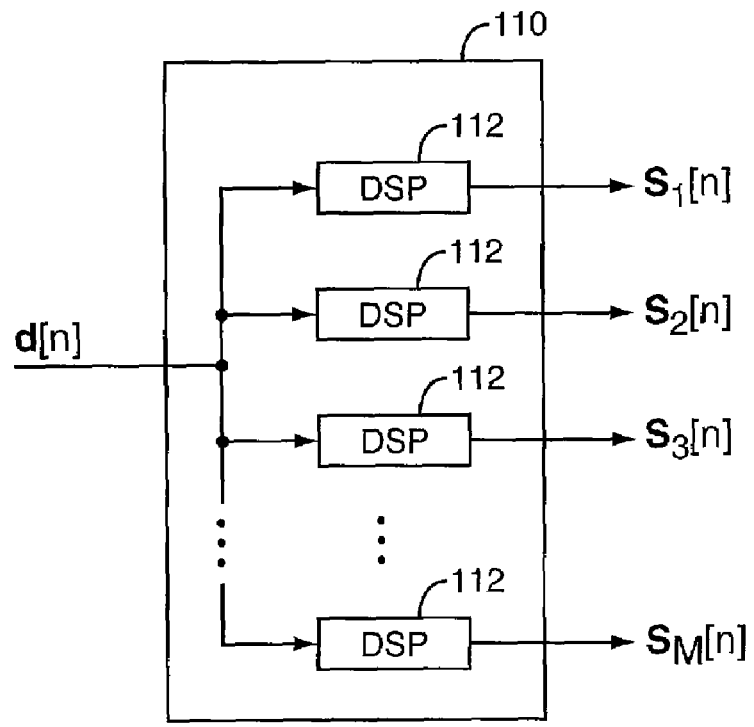
FIG. 5B shows another exemplary digital circuit for the modulator of FIG. 3.

FIG. 5B shows another exemplary digital modulator 110. Digital modulator 110 comprises a plurality of digital signal processors 112 that generate the M sample streams $S_m[n]$ responsive to the digital input signal d[n]. In one embodiment, each processor 112 computes the sample values for one sample stream. In another embodiment, each processor 112 computes the sample values for two or more sample streams. It will be appreciated that processors 112 may compute the sample values for each sample stream $S_m[n]$ using any known computational process, and may use look-up tables as part of the computational process.

Figure 6:
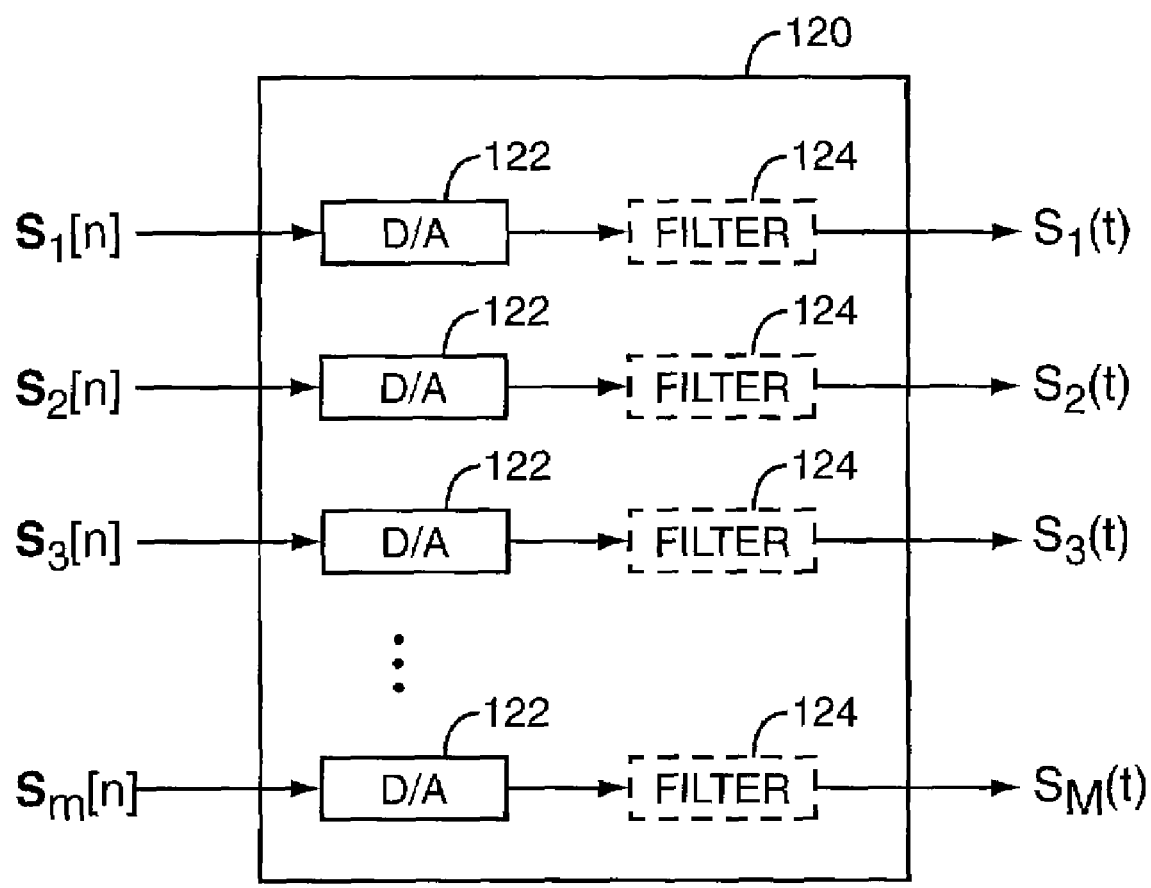
FIG. 6 shows one exemplary conversion circuit for the modulator of FIG. 3.

FIG. 6 shows one exemplary conversion circuit 120 comprising a plurality of digital-to-analog converters 122. The digital-to-analog converters 122 convert each sample stream $S_m[n]$ to a continuous analog signal $S_m(t)$. While FIG. 6 shows one digital-to-analog converter 122 per sample stream, it will be appreciated that conversion circuit 120 may convert two or more sample streams using one digital-to-analog converter 122. Alternatively, conversion circuit 120 may perform the conversion process using multiple digital-to-analog converters 122 for each sample stream. In addition, some embodiments of the conversion circuit 120 may generate the continuous analog signals by reducing the amplitude of transient signals present in the signals output by the digital-to-analog converters 112 using optional filters 124.

The digital-to-analog converters 122 may comprise any known digital-to-analog converters, including but not limited to pulse width modulation, delta, sigma-delta, cascaded sigma-delta, binary weighted, and R-2R ladder digital-to-analog converters. The resolution of the digital-to-analog converters 122 determines the noise floor of the resulting analog signals. One exemplary digital-to-analog converter may comprise the digital-to-analog converter disclosed in U.S. patent application Ser. No. 11/612,551 filed 19 Dec. 2006, which is incorporated herein by reference.

Achieving a low noise floor for transmitted signals is important when signals in a nearby frequency band are simultaneously received, such as in 3G WCDMA cellular systems that use frequency division duplex. It will be appreciated that the noise floor decreases as the resolution, i.e., word-length of the digital-to-analog converters 122 increases. Thus, the use of high-resolution digital-to-analog converters provide a straightforward way to reduce the noise floor.

In one embodiment, the digital-to-analog converters 122 may comprise delta or sigma-delta converters that employ oversampling and noise shaping to perform high-resolution digital-to-analog conversion. By oversampling, such converters spread the quantizing noise over more bandwidth, reducing the noise density per cycle. By using noise shaping, such converters move noise away from desired signal frequencies. Thus, by combining noise shaping with very large oversampling factors, i.e., 64:1, oversampled single-bit converters may achieve the accuracy of 16-bit digital-to-analog converters.

In order to use digital-to-analog converters 122 that require oversampled input sample streams, the sample rate associated with each sample stream $S_m[n]$ should be reduced. For example, when M=2048, the sampling rate required for a 2 GHz signal decreases to a 5.12 GHz÷2048=2.5 MHz sample rate for each sample stream. Then 2048, 64:1 oversampled and noise-shaped delta or sigma-delta converters would each operate with an output bit rate of 64×2.5 MHz=160 MHz, which is within the capability of current technology. Other variations are also possible. It will be appreciated that these realizations aim to utilize digital logic, which is postulated to improve in cost and performance inexorably with time according to Moore's law, to assist in achieving high resolution digital-to-analog conversion. Such techniques have been developed in order to exploit the expected continual shrinkage of digital circuit geometries to allow direct digital synthesis of modulated carrier waveforms with provision of a direct analog signal output.

For a given resolution, the noise floor may also or alternatively be reduced by rounding up or down a most significant portion of an input sample value before performing digital-to-analog conversion. In one embodiment, the least significant portion of a sample value may be used to make the round up/down decision. For example, adding the least significant portion of a previous sample value to the least significant portion of a current sample value may cause a rounding up of the most significant portion of the current sample value. If no rounding up occurs, a rounding down occurs by default when the digital-to-analog converter 122 converts the most significant portion of the current sample value. The modified least significant portion of the current sample value may then be added to a least significant portion of a subsequent sample value to determine an up or down rounding for the most significant portion of the subsequent sample value. By this means, the noise floor may be reduced in certain regions of the spectrum, depending on the spacing of the previous, current, and subsequent samples mentioned above. For example, if the time difference in the multiplex cycle is approximately an integer number of cycles of the carrier frequency being synthesized, the noise is reduced around the carrier frequency for the modulated analog carrier waveform. This also happens if the least significant portion of a first sample value is subtracted from a second sample value, where the second sample value is multiplexed an odd number of half cycles of the carrier frequency away from the first sample value in the multiplex cycle.

Figure 7:
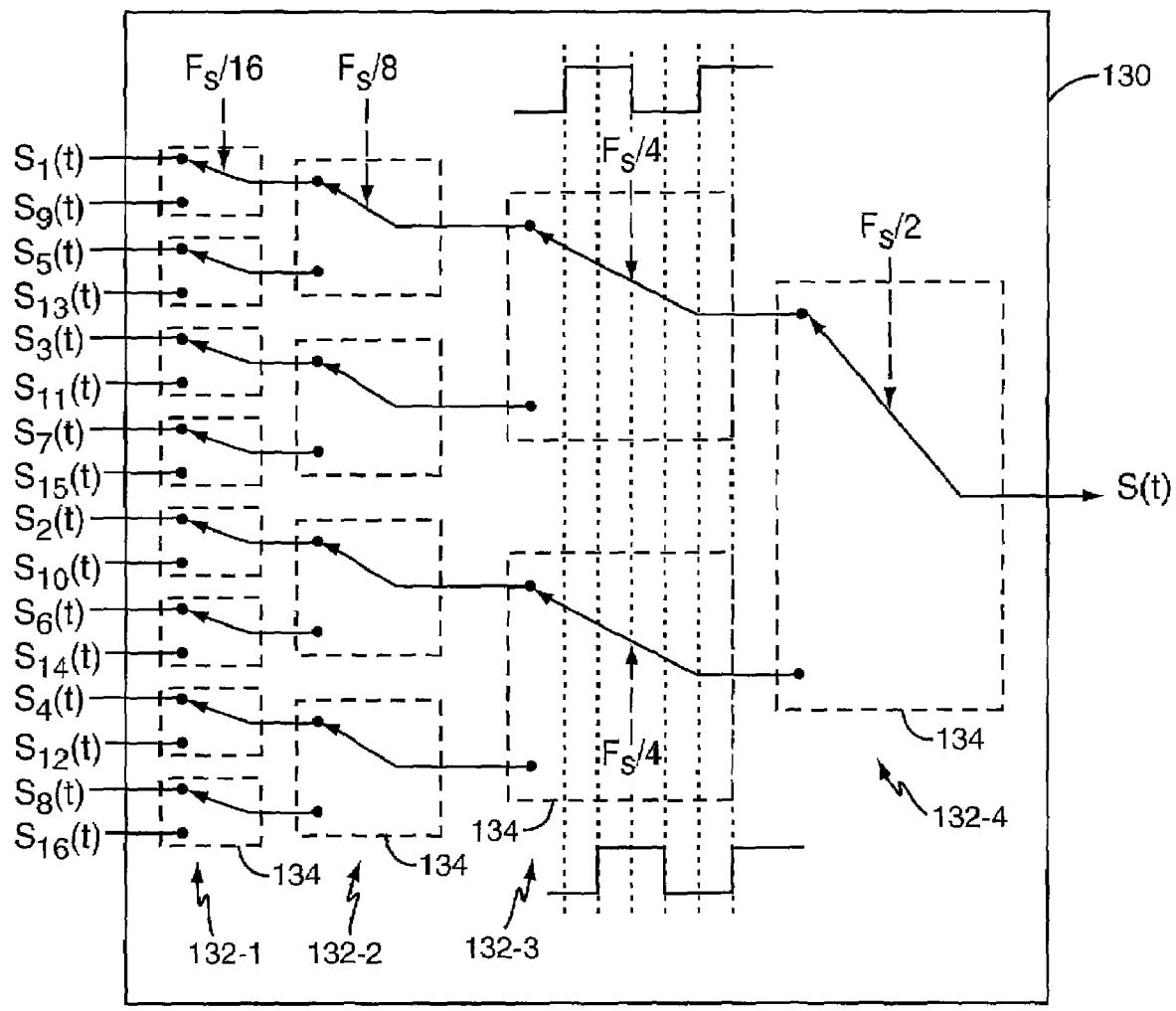
FIG. 7 shows one exemplary multiplexer for the modulator of FIG. 3.

FIG. 7 shows an exemplary multiplexer 130 for multiplexing the analog signals output by the conversion circuit 120. Multiplexer 130 multiplexes the analog signals output by the conversion circuit 120 to generate the modulated analog carrier waveform. The multiplexer 130 cyclically selects between the analog signals $S_m(t)$ to generate the composite modulated analog carrier waveform S(t). In one embodiment, multiplexer 130 may comprise an M×1 switch (not shown) that cyclically selects between the input analog signals at a selection frequency equal to the sample rate of the modulated digital carrier waveform. Such a switch may be impractical due to the high selection frequency. For example, the total stray capacitance appearing on all of the nodes of such a high-speed selection switch may limit the achievable selection frequency.

The illustrated multiplexer 130 uses a tree structure comprising multiple stages 132 to reduce the total stray capacitance on any one node of the multiplexer 130. Each stage 132 of the tree structure includes one or more 2×1 selection circuits 134. Each selection circuit 134 in the first stage 132-1 selects between a pair of inputs, and therefore requires a selection frequency of 1/16 the aggregate sample rate of the sample streams. The selection circuits 134 in the second stage 132-2 select analog signals output by a pair of selection circuits 134 from the first stage 132-1. Thus, the second stage selection circuits 134 require a selection frequency of 1/8 the sample rate of the aggregate sample rate. The selection circuits 134 in the third stage 132-3 select analog signals output by a pair of selection circuits 134 from the second stage 132-2, and therefore require a selection frequency of 1/4 the sample rate of the aggregate sample rate of the sample streams. The final stage 132-4 selects between the outputs of the third-stage selection circuits 134 at a selection frequency of 1/2 the sample rate of the aggregate sample rate. One cycle of the multiplexer 130 therefore recurs at a rate of 1/2 the sample rate of the aggregate sample rate. By progressively doubling the selection frequency of each stage, the multiplexer 130 shown in FIG. 7 reduces the effect of stray capacitance by reducing the number of switches that operate at a high frequency and that are connected to the same node.

Due to the tree structure of the multiplexer 130, the input analog signals $S_m(t)$ are arranged as shown in FIG. 7. This arrangement cyclically outputs consecutive analog signals in an even/odd pattern, i.e., $S_1(t), S_2(t), S_3(t) \ldots, S_M(t)$, to form the modulated analog carrier waveform $S(t)$ that corresponds to the desired modulated digital carrier waveform $S[n]$ while minimizing power consumption due to speed and stray capacitance effects. Further, this arrangement enables analog signals $S_m(t)$ to arrive at each stage 132 well before being selected for the next stage 132, which reduces transient noise due to settling effects.

Figure 8:
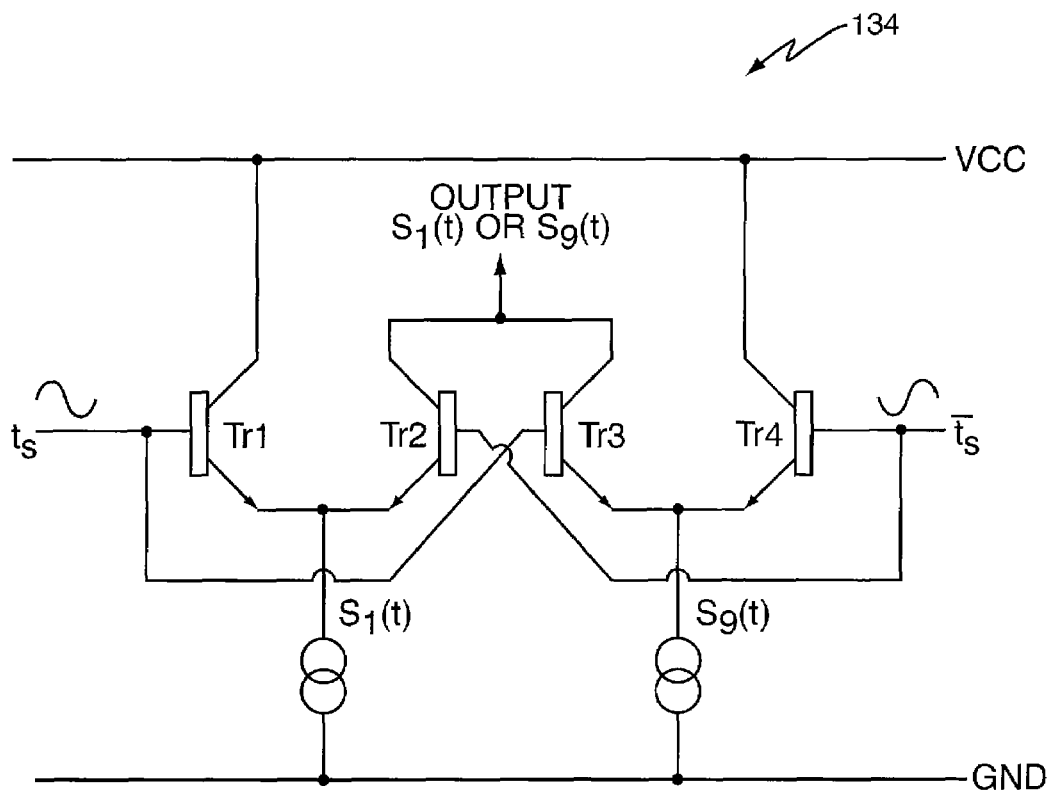
FIG. 8 shows one exemplary selection circuit for the multiplexer of FIG. 7.

FIG. 8 shows one exemplary 2×1 current-steering type of selection circuit 134 that selects between analog current signals. The current-steering selection circuit 134 comprises four transistors Tr1 ... Tr4. The selection circuit 134 selects between two analog current signals, i.e., $S_1(t)$ and $S_9(t)$, responsive to steering signals, which are labeled $t_s$ and $\bar{t}_s$. When $t_s$ is high and $\bar{t}_s$ is low, Tr1 and Tr3 are conductive and Tr2 and Tr4 are non-conductive, resulting in the transmission of $S_9(t)$ to the output. When $t_s$ is low and $\bar{t}_s$ is high, Tr1 and Tr3 are non-conductive and Tr2 and Tr4 are conductive, resulting in the transmission of $S_1(t)$ to the output. It will be appreciated that the selection circuit 134 of FIG. 8 may be comprised of MOS or bipolar transistors. Further, it will be appreciated that the selection circuit 134 may alternatively comprise a voltage-steering type of selection circuit constructed with four CMOS transistors that select between analog voltage signals. Both the current-steering and voltage-steering selection circuits represent some of the fastest selection circuits currently available.

Figure 9:
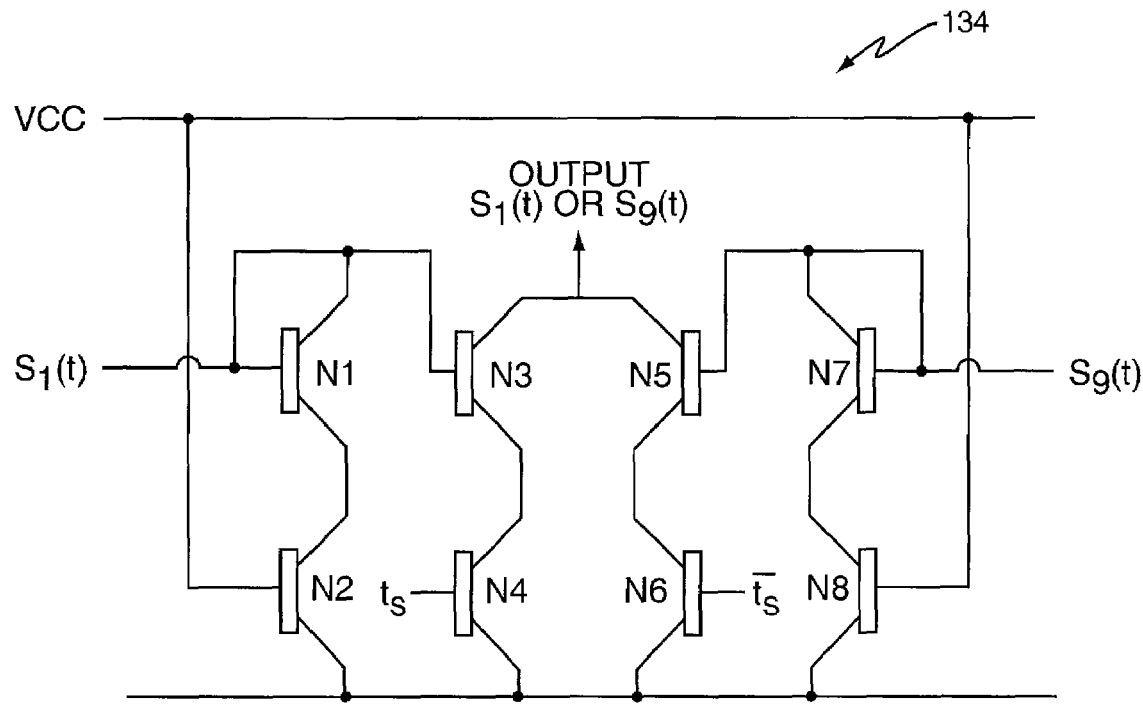
FIG. 9 shows another exemplary selection circuit for the multiplexer of FIG. 7.

FIG. 9 shows another exemplary selection circuit 134, which may be built with CMOS (NMOS or PMOS) transistors, and which represents a current selection circuit that selects between two analog current signals. In FIG. 9, N-type field effect transistors N1 and N3 form a current mirror. Both N1 and N3 in this current mirror have second transistors N2 and N4 in their source circuits. As long as N1 and N3 are identical and N2 and N4 are identical and both turned on, N3 outputs a current that is an accurate reflection of $S_1(t)$. If, on the other hand, N4 is turned off while N2 is on, N3 will not output $S_1(t)$. The N2 transistor is kept permanently on by wiring its gate to VCC. The N5, N7, N6, and N8 transistors form an identical arrangement for mirroring $S_9(t)$, where N8 is kept permanently on by wiring its gate to VCC. Thus, by turning on either N4 or N6, and using opposite phases of a clock $t_s$, the selection circuit 132 outputs either $S_1(t)$ or $S_9(t)$. The selected output current may be connected to a first input of an identical current selector constructed with P-type transistors, in a mirror-image circuit based on VCC rather than ground. The output of that P-type current selector may be an input to another N-type circuit, and so forth to generate the desired number of stages 132 for the multiplexer 130.

The type of CMOS multiplexer described above with the aid of FIG. 9 may also provide current scaling. If N1 and N3 are not identical but have a width ratio of α, the output current will be α times the input current. The width ratio of N4 to N2 should be scaled by the same factor to ensure that N4 has an identical effect in the source circuit of N3 as N2 has in the source circuit of N1. Current amplification may result in a more current-efficient multiplexer 130 by ensuring that the output current of the final stage 132 is greater than the intermediate stage currents.

Figure 10:
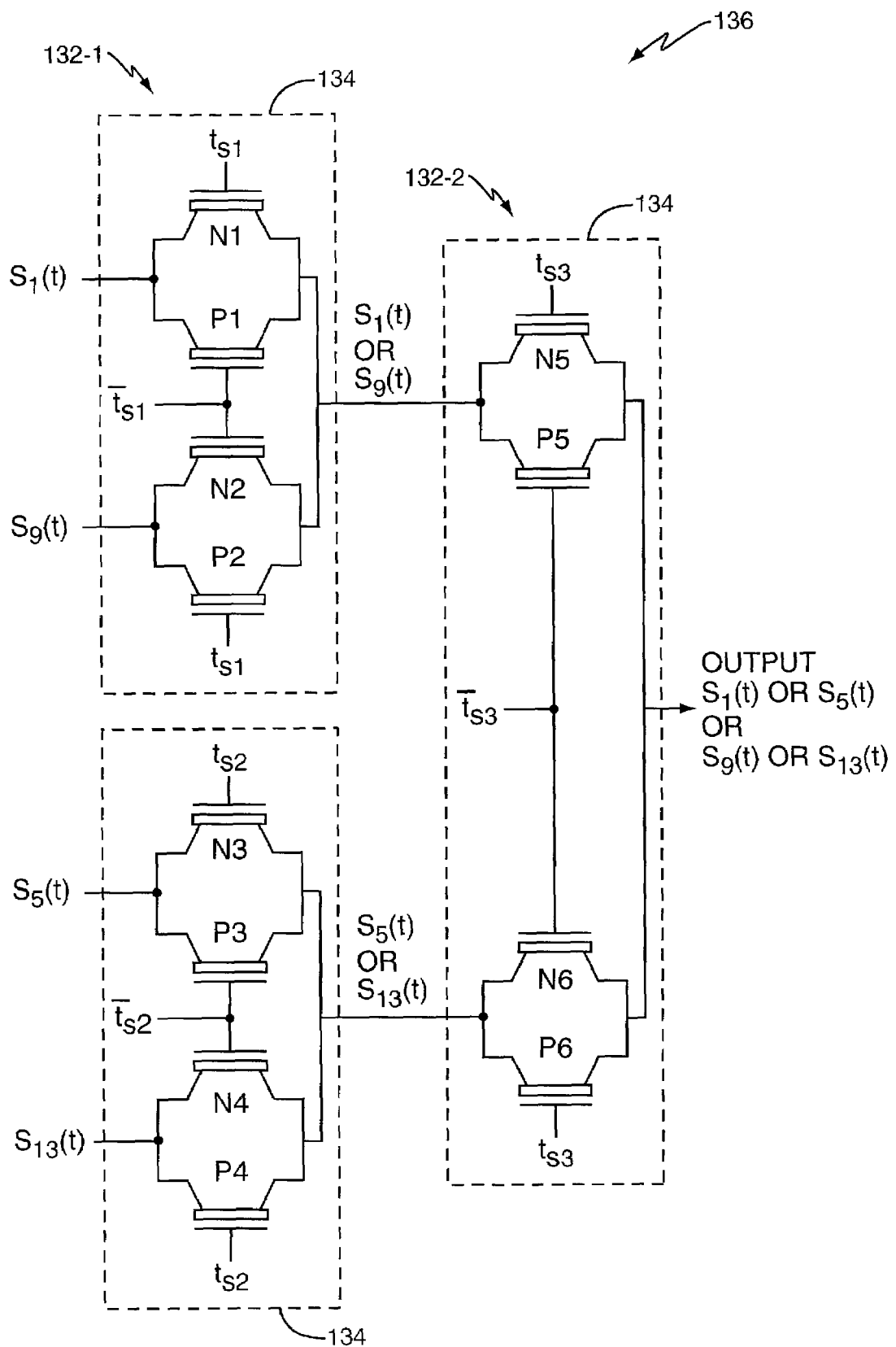
FIG. 10 shows one exemplary selection circuit configuration for the multiplexer of FIG. 7.

FIG. 10 shows an exemplary 4×1 multiplexing circuit 136 that may also be used to construct multiplexer 130. The 4×1 multiplexing circuit 136 comprises two stages 132-1, 132-2 of 2×1 voltage-selection circuits 134 constructed using bilateral CMOS transmission gates. Each 2×1 selection circuit 134 comprises two transmission gates. Each transmission gate comprises an N-type and a P-type FET, i.e., N1 and P1, arranged back-to-back. The N-type FET is gated with a select signal $t_{s1}$, which is applied to the gate of transistor N1, while the P-type transistor is gated with the inverse select signal $\bar{t}_{s1}$ applied to the gate of transistor P1. The select signals applied to N2 and P2 are reversed compared to N1 and P1, so that when $t_{s1}$ is high and $\bar{t}_{s1}$ is low, the transmission gate with N1 and P1 conducts to pass $S_1(t)$, while when $t_{s1}$ is low and $\bar{t}_{s1}$ is high, the transmission gate with N2 and P2 conducts to pass $S_9(t)$. Thus, the polarity of $t_{s1}$ and $\bar{t}_{s1}$ determines whether the top selection circuit 134 in the first stage 132-1 passes $S_1(t)$ or $S_9(t)$ to the next stage. Likewise, $t_{s2}$ and $\bar{t}_{s2}$ determines whether the bottom selection circuit 134 of the first stage 132-2 passes $S_5(t)$ or $S_{13}(t)$ to the next stage. The control signals $t_{s3}$ and $\bar{t}_{s3}$ applied to the selection circuit 134 in the second stage 132-2 determine which signals are output. It will be appreciated that other configurations of the 4×1 multiplexing circuit 136 may be constructed using only transistors (N1, P1), (N2, P2), (N3, P3), and (N4, P4). Such a multiplexer is referred to herein as a parallel voltage-selection multiplexer. By driving the gates of these transistors with control signals $(t_{s1}, \bar{t}_{s1}), (t_{s2}, \bar{t}_{s2}), (t_{s3}, \bar{t}_{s3})$, and $(t_{s4}, \bar{t}_{s4})$, only one set of which enables its respective transmission gate to pass the associated input signal voltage to the output, the output voltage is again selectable to either $S_1(t), S_9(t), S_5(t),$ or $S_{13}(t)$. In this case, the outputs of the selection circuits 134 are connected in parallel.

It will be appreciated that the parallel voltage selection multiplexer may be expanded so that any number of inputs may be selected. One difference with this configuration as compared with the binary tree multiplexer shown in FIG. 7 is that the number of different control signals equals the number of input signals. Thus for M=16, the binary tree multiplexer requires $LOG_2(16)=4$ selection signals, while the parallel voltage selection multiplexer would require 16 selection signals. Also, the parallel configuration of the transmission gate outputs causes a build-up of node capacitance, which may limit the selection frequency. The final difference is that only the final stage of the binary tree multiplexer operates at a maximum selection frequency, while the earlier stages operate at progressively half the frequency. In contrast, each selection circuit 134 in the parallel voltage selection multiplexer operates at the maximum selection frequency.

It will be appreciated that multiplexer 130 may be constructed using a balanced multiplexer configuration. Balanced multiplexers are useful for signals that swing positively and negatively. A current I and a complementary current $\bar{I}$ may represent such signals. If $\bar{I}$ equals the difference between a maximum current and I, where the maximum current is a greatest possible current, the balanced multiplexer 130 may be described as a class-A push-pull type multiplexer. If on the other hand $\bar{I}$ is zero while I is non-zero for positive signal values, and I is zero while $\bar{I}$ is non-zero for negative signal values, the multiplexer 130 may be described as a class-B push-pull multiplexer. If I and $\bar{I}$ are produced by transistor circuits of identical polarity, and the respective outputs connected to a balanced load, possibly via a balanced-to-unbalanced transformer, the circuit may be described as a double-ended push-pull multiplexer. If on the other hand I and $\bar{I}$ are produced by transistor circuits of opposite polarity and their outputs directly joined together, the circuit may be described as a single-ended push-pull multiplexer. As in the case of the current-selection multiplexers, a voltage-selection multiplexer such as in FIG. 10 may be built in a balanced configuration, in which two such structures are used to select between balanced input voltage pairs V,$\bar{V}$ to provide a balanced output.

Figure 11:
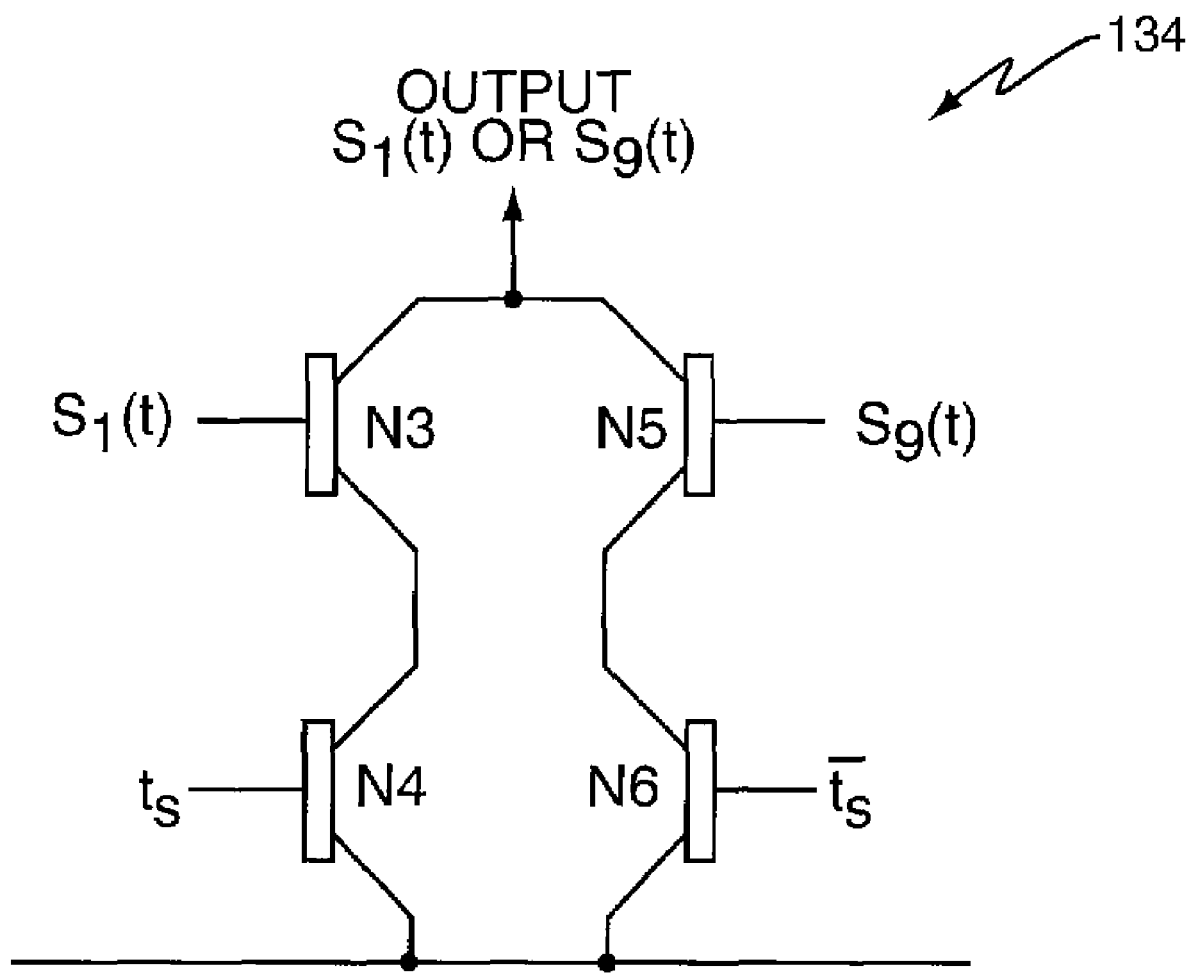
FIG. 11 shows another exemplary selection circuit for the multiplexer of FIG. 7.

In principle, all of the selection circuits 134 described above may be constructed with either field effect or bipolar transistors in any semiconductor process (silicon, gallium arsenide or Indium phosphide). In addition, it is possible to mix current and voltage-selection circuits by using voltage-to-current (transconductance) or current-to-voltage (transimpedance) converters between stages of different type. For example, FIG. 11 shows an exemplary transconductance selection circuit 134.

Figure 12:
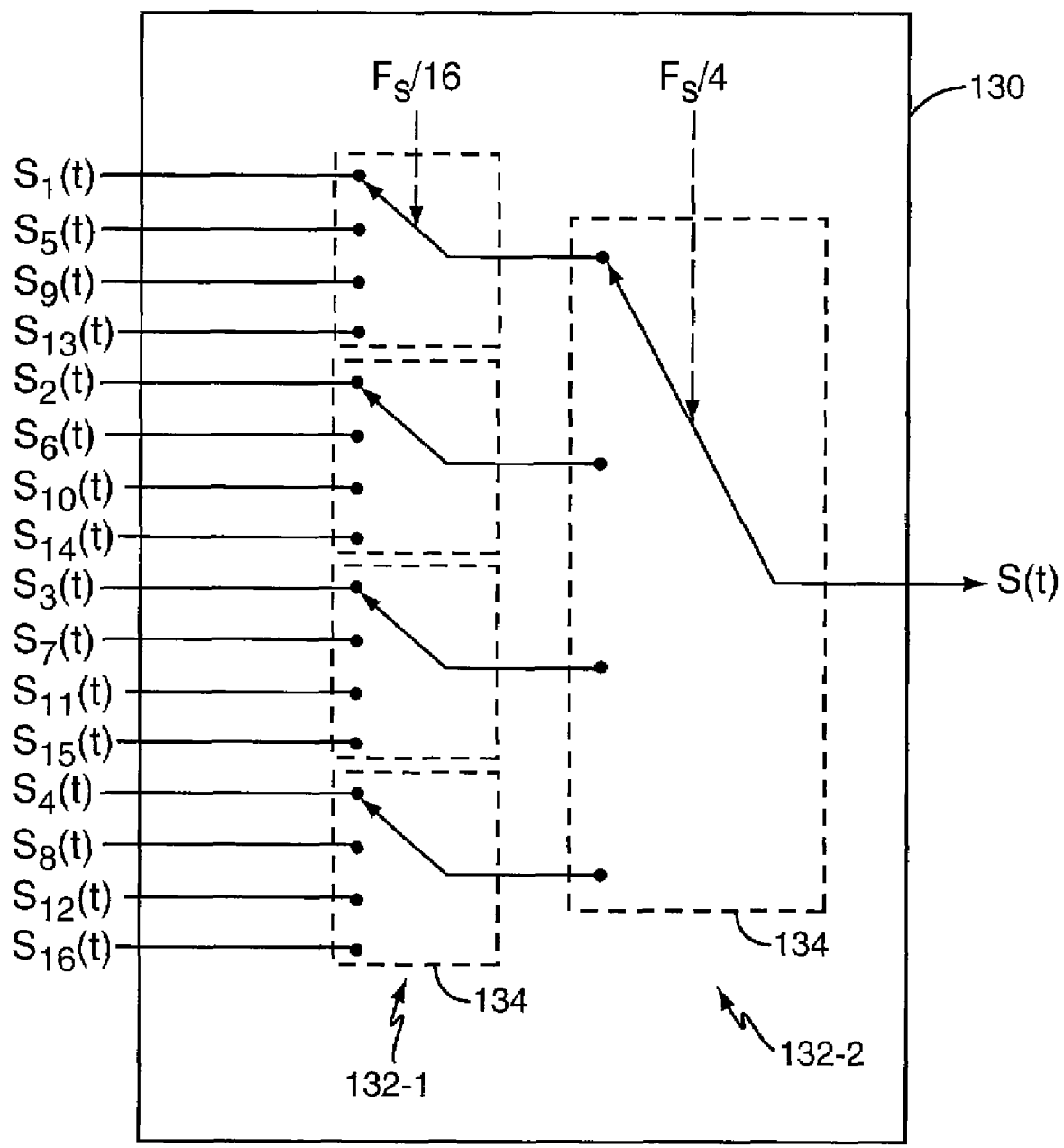
FIG. 12 shows another exemplary multiplexer for the modulator of FIG. 3.

It will be appreciated that tree-structures other than the binary tree structure of FIG. 7 may also be constructed. For example, ternary trees using 3-way selection circuits or quaternary trees using 4-way selection circuits, as shown in FIG. 12, may also be constructed. The example shown in FIG. 12 uses two stages 132-1, 132-2 of 4-way selection circuits 134. The selection circuits 134 in the first stage 132-1 operate at one quarter the output sample rate, while the selection circuit 134 in the second stage 132-2 operates at the output sample rate. As discussed above, transient settling effects may be minimized by changing the selection of the selection circuits 134 in the first stage 132-1 at a time when they are not selected by the selection circuit 134 in the second stage 132-2. The illustrated quaternary multiplexer 130 is likely to have more stray capacitance limitations than the previously described binary multiplexer 130. However, the quaternary multiplexer 130 may still have multiple applications depending on the current technology. The optimum configuration may be determined by evaluating both binary and non-binary tree structures using a chip circuit simulation program.

The above-described modulator 100 and modulation process 200 provide the direct digital synthesis of modulated analog carrier waveforms at as high a frequency as possible. It will be appreciated that various speed enhancing means, such as inter-stage voltage followers, may be inserted by a person of normal skill and their benefits evaluated using standard chip simulation programs.

Further, the circuits 110-130 in the modulator 100 described above are generally aperiodic. Thus, the modulator 100 of the present invention is suitable for use in multi-band wireless communication devices that may transmit in any one of a plurality of frequency bands allocated to various service providers in different parts of the world.

The above describes the invention in terms of sample streams $S_m[n]$ having a sample rate of 160 MHz. It will be appreciated that the 160 MHz sample rate was selected based on the widest cellular band in common use, which is 90 MHz. If $\omega_o$ is somewhere near the center of such a band, then $\omega - \omega_o$ will be somewhere between 45 MHz and 90 MHz. For purposes of illustration, assume $\omega - \omega_o = 80$ MHz. For this example, the highest frequency component in the frequency band of the modulated analog carrier waveform S(t) computed using P'(t) will be 80 MHz, which requires a minimum sample rate of 160 MHz.

Figure 13:
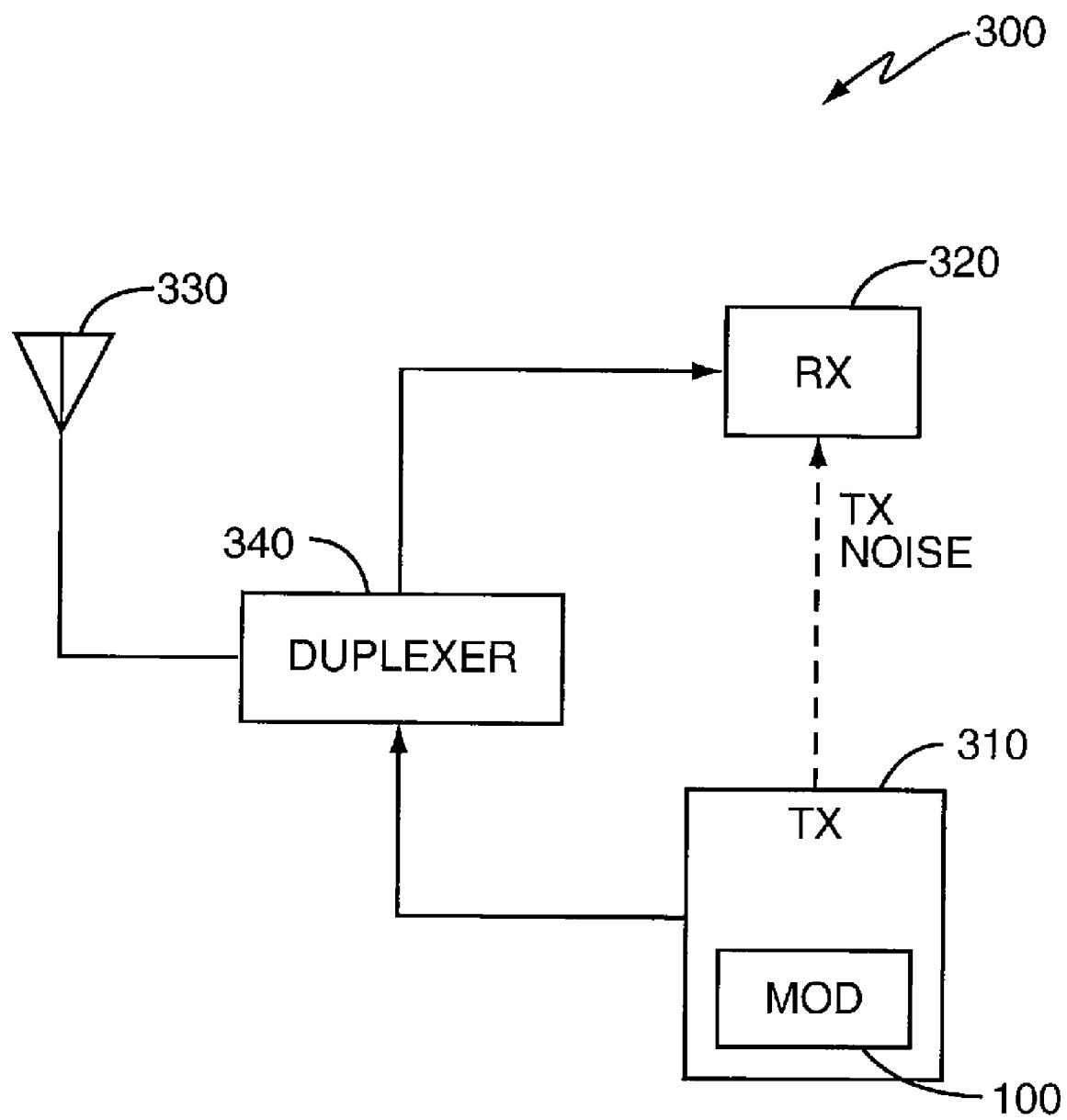
FIG. 13 shows a communication circuit for an exemplary wireless communication device according to one exemplary embodiment.

The above-described modulator may also be used to reduce transmitter noise present in a receiver. FIG. 13 shows one exemplary communication circuit 300 comprising a transmitter 310, comprising the modulator 100, and a receiver 320. The transmitter 310 and receiver 320 connect to an antenna 330 via a duplexer 340. The duplexer 340 typically provides limited isolation in the receiver 320 from wideband transmitter noise.

The modulator 100 of the present invention may be used to provide a prediction of the transmitter noise to the receiver 320. This is especially true when using oversampled sigma-delta or delta D-to-A converters 122. The output value that the single-bit output stream approximates is generally available inside each digital-to-analog converter 122. Further, the difference or error between the approximate value and the actual value is also generally available. Alternatively, if the exact value is available in digital form to a desired accuracy, e.g., 24-bit accuracy, but only the most significant bits (e.g., the most significant 12 bits) undergo digital-to-analog conversion, the unused least significant bits represent an error. There may be an additional digital-to-analog conversion error that is a function of the most significant bits. This conversion error may be stored in a look-up table. Thus, the quantizing noise error may be known and available in digital form. The quantizing noise error is often used in cascade converters. In particular, an oversampled sigma-delta converter 122 may filter the quantizing noise error to the desired output signal spectrum range, and then convert this filtered error using a second oversampled single-bit converter. The converted error signal is then combined with the original signal approximation in such a way as to substantially cancel the error, thereby achieving higher accuracy in the digital-to-analog conversion.

The same principle may be employed to reduce transmit noise in the receiver 320. More particularly, the error signal provided by one or more of the digital-to-analog converters 122 in the conversion circuit 120 may be digitally frequency shifted to the frequency channel of the receiver 320, and subsequently filtered to approximate the noise waveform generated by the transmitter 310 in the receiver frequency channel. Such an approximation does not include an unknown amplitude scaling and phase shift. Many types of receivers 320 may determine the latter unknowns by correlation in such a way as to determine the amplitude and phase shift needed to subtract at least some of the transmitter noise present in the receiver 320 from the received signals, and therefore, to achieve noise reduction. For example, receiver 320 may correlate a received signal with a known pattern embedded in the signal transmitted by a remote transmitter to determine phases and amplitudes of desired signal components, and also to correlate the received signal with the estimate of the transmitter noise provided by the transmitter 310 to determine the phase and amplitude of the known noise component. Receiver 320 may also compute the average of the received signal to determine any unwanted DC component. Using this information, a maximum-likelihood sequence estimation technique, such as a Viterbi Equalizer, may correctly decode the signal. Similarly, a RAKE receiver for CDMA signals may correlate the received signal with codes known to be used by a remote transmitter, as well as with the known transmitter noise from the transmitter 310, and use the correlations to decode the desired signals in an optimum way.

In yet another variation, when a cascade digital-to-analog converter 122 is used to produce a desired transmitter signal, the residual quantizing noise of the cascade converter 122 is minimized when the error signal is added to the main signal in the correct proportion. If too much or too little of the error signal is added, the excess or deficiency appears as a transmitter noise signal that comprises noise correlated with the error signal. This may be detected in a receiver 320 that correlates at least a portion of the transmitter noise signal with the received signal and determines whether the proportion of the error signal added to the main signal should be increased or decreased. After increasing or decreasing the proportion of error signal used, the transmitter noise signal is thereby also reduced in the transmitter 310 and the receiver 320. In this way, the receiver assists the digital-to-analog conversion process in achieving a minimum noise floor.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

We claim:

1. A modulator comprising:
   a digital modulator to generate a plurality of sample streams representing a desired modulated digital carrier waveform modulated by a digital input signal at a plurality of different sample phases;
   a plurality of digital-to-analog converters to convert each sample stream into a continuous analog signal; and
   a multiplexer to multiplex the analog signals together to generate a modulated analog carrier signal for transmission.

2. The modulator of claim 1 wherein the digital modulator generates each sample stream by generating a plurality of sample values for each sample stream spaced by a predetermined sampling interval.

3. The modulator of claim 1 wherein the digital modulator comprises a plurality of digital signal processors, wherein each digital signal processor generates one sample stream.

4. The modulator of claim 3 wherein a first digital signal processor generates a first sample stream by generating a first set of sample values spaced by a predetermined sampling interval, and wherein a second digital signal processor generates a second sample stream by generating a second set of sample values offset from the first set and spaced by the predetermined sampling interval.

5. The modulator of claim 1 further comprising a plurality of analog filters, wherein each analog filter is configured to filter an output from one digital-to-analog converter to generate the corresponding continuous analog signal.

6. The modulator of claim 1 wherein each digital-to-analog converter is configured to convert one or more of the sample streams into the corresponding continuous analog signals.

7. The modulator of claim 1 wherein two or more of the digital-to-analog converters are configured to convert one sample stream into the corresponding continuous analog signal.

8. The modulator of claim 1 wherein the plurality of digital-to-analog converters comprises a plurality of sigma-delta converters.

9. The modulator of claim 8 wherein at least one of the sigma-delta converter comprises a cascade sigma-delta converter.

10. The modulator of claim 8 wherein the sigma-delta converters include a noise shaping processor to reduce quantizing noise in the continuous analog signals.

11. The modulator of claim 1 wherein each digital-to-analog converter converts a most significant portion of sample values in the input sample stream to generate the continuous analog signal.

12. The modulator of claim 11 wherein the digital-to-analog converters round up or down the most significant portion of each sample value based on a least significant portion of at least one sample value.

13. The modulator of claim 12 wherein the digital-to-analog converters round up or down the most significant portion of each sample value based on a combination of the least significant portions of a current and the least significant portion of a previous sample value.

14. The modulator of claim 1 wherein said multiplexer comprises a tree structure having multiple stages of selection circuits, wherein each stage of selection circuits cyclically selects between multiple input analog signals at a predetermined selection frequency.

15. The modulator of claim 14 wherein the selection frequency for each stage is determined based on an aggregate sample rate of the sample streams and the number of analog signals input at each stage.

16. The modulator of claim 14 wherein the selection frequency of one stage of selection circuits is half the selection frequency of a subsequent stage of selection circuits.

17. The modulator of claim 14 wherein the at least one selection circuit scales the output of each stage based on a predetermined scaling factor.

18. The modulator of claim 1 wherein said multiplexer comprises:
   a first stage of selection circuits configured to cyclically select at a first frequency between a pair of input analog signals; and
   a second stage of selection circuits configured to cyclically select at a second frequency between a pair of analog signals output by the first stage of selection circuits, wherein the second frequency is twice the first frequency.

19. The modulator of claim 1 wherein the multiplexer comprises one of a current selection multiplexer, a voltage selection multiplexer, a current steering multiplexer, and a voltage steering multiplexer.

20. The modulator of claim 19 wherein the multiplexer comprises a balanced multiplexer.

21. The modulator of claim 1 wherein a bandwidth of each sample stream corresponds to a difference between a sample rate of the desired modulated digital waveform and a nearest harmonic of a sample rate of the sample stream.

22. The modulator of claim 1 further comprising an error processor configured to generate an analog noise waveform in a receiver frequency band and to provide the noise waveform to a receiver to cancel transmitter noise from a receiver input signal.

23. The modulator of claim 22 wherein the error processor comprises:
 a frequency processor configured to frequency shift an error signal; and
 a filter configured to filter the frequency shifted error signal to generate the analog noise waveform.

24. The modulator of claim 1 wherein the modulator is disposed in at least one of a wireless communication device and network communication device.

25. A method of generating an analog carrier frequency signal comprising:
 generating a plurality of sample streams representing a desired modulated digital carrier waveform modulated by a digital input signal at a plurality of different sample phases;
 converting each sample stream into a continuous analog signal; and
 multiplexing the analog signals together to generate a modulated analog carrier signal for transmission.

26. The method of claim 25 wherein generating the plurality of sample streams comprises spacing a plurality of sample values in each sample stream by a predetermined sampling interval.

27. The method of claim 25 wherein generating the plurality of sample streams comprises generating a first set of sample values for a first sample stream and generating a second set of sample values for a second set of sample streams, wherein the first set of sample values are spaced by a predetermined sampling interval, and wherein the second set of sample values are offset from the first set and spaced by the predetermined sampling interval.

28. The method of claim 25 wherein converting each sample stream comprises filtering an analog version of each sample stream to generate the continuous analog signals.

29. The method of claim 25 wherein each digital-to-analog converter is configured to convert one or more of the sample streams into the corresponding continuous analog signals.

30. The method of claim 25 further comprising using noise shaping to reduce quantizing noise in the continuous analog signals.

31. The method of claim 25 wherein converting each sample stream comprises converting a most significant portion of sample values in each sample stream to generate the continuous analog signals.

32. The method of claim 31 wherein converting each sample stream further comprises rounding up or down the most significant portion of each sample value based on a least significant portion of at least one sample value.

33. The method of claim 32 wherein rounding up or down the most significant portion of each sample value comprises rounding up or down the most significant portion of each sample value based on a combination of the least significant portions of a current and a previous sample value.

34. The method of claim 25 wherein multiplexing the analog signals comprises cyclically selecting between the analog signals at a predetermined selection frequency.

35. The method of claim 34 wherein cyclically selecting between the analog signals comprises cyclically selecting in a first stage between the analog signals at a first predetermined selection frequency, and cyclically selecting in a second stage between the analog signals output from the first stage at a second predetermined frequency faster than the first predetermined frequency.

36. The method of claim 35 wherein the selection frequency for each selection stage is determined based on an aggregate sample rate of the sample streams and the number of analog signals input at each stage.

37. The method of claim 35 wherein the selection frequency of one selection stage is half the selection frequency of a subsequent selection stage.

38. The method of claim 35 wherein multiplexing the analog signals further comprises scaling the output of each selection stage based on a predetermined scaling factor.

39. The method of claim 25 wherein multiplexing the analog signals comprises:
 cyclically selecting at a first frequency between a pair of input analog signals; and
 cyclically selecting at a second frequency between a pair of analog signals output by the first stage of selectors, wherein the second frequency is twice the first frequency.

40. The method of claim 25 wherein a bandwidth of each sample stream corresponds to a difference between a sample rate of the desired modulated digital waveform and a nearest harmonic of a sample rate of the sample stream.

41. The method of claim 25 further comprising generating an analog noise waveform in a receiver frequency band and providing the noise waveform to a receiver to cancel transmitter noise from a receiver input signal.

42. The method of claim 41 wherein generating the analog noise waveform comprises:
 frequency shifting an error signal; and
 filtering the frequency shifted error signal to generate the analog noise waveform.

* * * * *